United States Patent
Mukai et al.

(10) Patent No.: US 6,514,882 B2
(45) Date of Patent: Feb. 4, 2003

(54) AGGREGATE DIELECTRIC LAYER TO REDUCE NITRIDE CONSUMPTION

(75) Inventors: Kevin M. Mukai, Santa Clara, CA (US); Shankar Chandran, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/789,455

(22) Filed: Feb. 19, 2001

(65) Prior Publication Data

US 2002/0115302 A1 Aug. 22, 2002

(51) Int. Cl.[7] .............................................. H07L 21/469
(52) U.S. Cl. ........................ 438/783; 438/778; 438/791
(58) Field of Search .......................... 257/760; 438/400, 438/418, 758, 763, 774, 791, 783, 778

(56) References Cited

U.S. PATENT DOCUMENTS

| 4,091,407 A | 5/1978 | Williams et al. |
| 4,952,524 A | * 8/1990 | Lee et al. ................... 438/437 |
| 5,166,088 A | 11/1992 | Ueda et al. |
| 6,153,903 A | 11/2000 | Clampitt |

FOREIGN PATENT DOCUMENTS

| JP | A-57199224 | 12/1982 |
| JP | A-07183250 | 7/1995 |

OTHER PUBLICATIONS

Nag, S., et al., "Low–temperature pre–metal dielectrics for future ICS," Solid State Technology, vol. 41, No. 9, PennWell Publishing, pp. 69–78, 74, 76, 78, Sep. 1998.

* cited by examiner

Primary Examiner—Michael Sherry
Assistant Examiner—Lisa Kilday
(74) Attorney, Agent, or Firm—Blakely, Sokoloff, Taylor & Zafman

(57) ABSTRACT

A method including over a substrate, forming an aggregate comprising a barrier layer between a first dielectric layer comprising nitrogen and a second dielectric layer comprising phosphorous, and after forming the aggregate, thermally treating the substrate. An apparatus including a substrate and an aggregate formed over the substrate including a barrier layer between a first dielectric layer comprising nitrogen and a second dielectric layer comprising phosphorous.

15 Claims, 2 Drawing Sheets ly isolate different active devices (e.g., transistors) from one another on a substrate. Dielectric or passivation layers (films) are also used to isolate one conductor from another in multi-level interconnect systems such as in integrated circuit structures.
AGGREGATE DIELECTRIC LAYER TO REDUCE NITRIDE CONSUMPTION

FIELD OF THE INVENTION

The invention relates to passivation or dielectric layers used in, for example, circuit structures.

BACKGROUND

Dielectric layers or films are used to electrically isolate one device from another in a circuit structure and one level of conductor from another in multi-level interconnect systems such as found in many integrated circuit structures. A microprocessor, for example, may have five or more levels of interconnect over a substrate such as a semiconductor substrate.

There can be a significant difference between various dielectric layers or films in a multi-level interconnect system or structure. For example, pre-metal dielectric (PMD) layers or films are typically used between the substrate or device base (e.g., the substrate containing active devices therein/thereon), or other local-interconnect level material, and the first interconnect level (e.g., Metal 1). PMD layers or films can typically be deposited (and densified if necessary) at a higher temperature than is possible for intermetal dielectric layers. Furthermore, PMD films can be flowed and reflowed at temperatures in excess of 700° C. to promote gap fill. As interconnect structures are introduced over a substrate, the maximum temperature for introduction of a dielectric layer or film tends to be reduced, because metal interconnects tend to melt at temperatures in excess of 400° C. (e.g., at aluminum or copper melting temperatures).

The PMD layer or film isolates devices in an integrated circuit structure in two ways. It isolates devices electrically from interconnect layers, and it isolates devices physically from contamination sources such as mobile ions (e.g., from post-processing and handling). Mobile ions such as sodium and potassium tend to degrade essential device characteristics such as the threshold voltage of a transistor device.

As device densities increase on a circuit structure or substrate, the ability of the PMD layer or film to achieve void-free gap fill becomes increasingly important. For example, in sub 0.25 micron (um) devices, one criteria for filling a gap in a PMD process is 0.1 microns ($\mu$m) with a 5 to 1 aspect ratio.

Borophosphosilicate glass (BPSG)-silicon dioxide ($SiO_2$) is one well known material for a PMD layer or film. BPSG typically contains about two to six weight percent each of boron and phosphorous. BPSG is typically deposited using thermal chemical vapor deposition (CVD) at 400 to 700° C., and then annealed (reflowed) at 700 to 1000° C. In general, the phosphorus in BPSG acts as a gettering agent for any mobile ions that may diffuse toward the devices (e.g., transistors), while the boron provides good gap fill because it tends to soften the layer after the reflow anneal.

In a typical fabrication process of a state of the art integrated circuit structure, a thin layer of silicon nitride ($Si_3N_4$) is introduced over the substrate as an initial dielectric layer or film followed by, for example, a BPSG layer or film. In addition to its passivation property, the silicon nitride also serves in one instance as an etch stop in planarizing a subsequently introduced PMD layer or film, such as a BPSG layer or film.

As noted above, gap fill of a PMD layer or film is increasingly important as device densities increase. The gap fill properties of a BPSG layer or film is optimized by annealing at more than 800° C. The high temperature anneal tends to increase the reflow ability of the BPSG. However, one drawback to the high temperature anneal and reflow process is that the BPSG material tends to consume nitrogen from the underlying silicon nitride layer or film. The nitride consumption tends to degrade the insulating properties of the silicon nitride material. Thus, what is needed is a way to control the nitrogen consumption of nitrogen-containing layers or films in conjunction with a thermal processing in the presence of phosphorous.

SUMMARY OF THE INVENTION

In one embodiment, a method includes, over a circuit substrate, forming an aggregate comprising a barrier layer between a first dielectric layer comprising nitrogen and a second dielectric layer comprising phosphorus. In this embodiment, the method also includes, after forming the aggregate, thermally treating the circuit substrate. A suitable introduction point for implementing the method described herein is in a PMD layer or film, wherein the circuit substrate comprises a device base and at least one metal layer and the aggregate is introduced between the device base and the at least one metal layer. Suitable barrier layers include dielectric materials, particularly silicates such as borosilicate glass (BSG) or undoped silicate glass (USG). A thin film of, for example, BSG or USG between a silicon nitride film an d BPSG material tends to reduce the consumption during reflow (thermally annealing) the BPSG.

In another embodiment, the invention relates to an apparatus. The apparatus includes, in one aspect, a circuit substrate and an aggregate comprising a barrier layer between a first dielectric layer comprising nitrogen and a second dielectric layer comprising phosphorus. One example is an aggregate as a PMD layer or film comprising a barrier layer of a dielectric material such as BSG or USG disposed between a silicon nitride layer and a BPSG layer as the aggregate of a PMD film.

Additional features, embodiments, and benefits will be evident in view of the figures and detailed description presented herein.

BRIEF DESCRIPTION OF THE DRAWINGS

The invention is illustrated by way of example and not by way of limitation in the figures of the accompanying drawings in which like references indicate similar elements. It should be noted that references to "an" embodiment in this disclosure are not necessarily to the same embodiment, and they mean at least one.

DETAILED DESCRIPTION

An aggregate suitable as a dielectric or passivation layer of an integrated circuit structure is described, as is an embodiment of a method of implementing the aggregate and an apparatus including the aggregate.

In one embodiment, a method is disclosed including, over a circuit substrate, forming an aggregate comprising a barrier layer between a first dielectric layer comprising nitrogen and a second dielectric layer comprising phosphorus; and, after forming the aggregate, thermally treating the circuit substrate. As a PMD layer, one example of an aggregate is a barrier layer or film that is a dielectric material such as borosilicate glass (BSG) or undoped silicate glass (USG) separating a silicon nitride layer or film from a borophosphosilicate glass (BPSG) layer or film. In this matter, the barrier layer or film reduces or minimizes the nitrogen consumption generally seen between the BPSG layer or film and the silicon nitride layer or film, particularly during thermal reflow.

In the following description, an aggregate is described. It is to be appreciated that the word aggregate includes multiple layers or films introduced or formed on a circuit substrate. In this sense, an aggregate as described herein includes or may be referenced as a "layer" as, for example, a PMD layer or intermetal layer is described.

Figure 1:
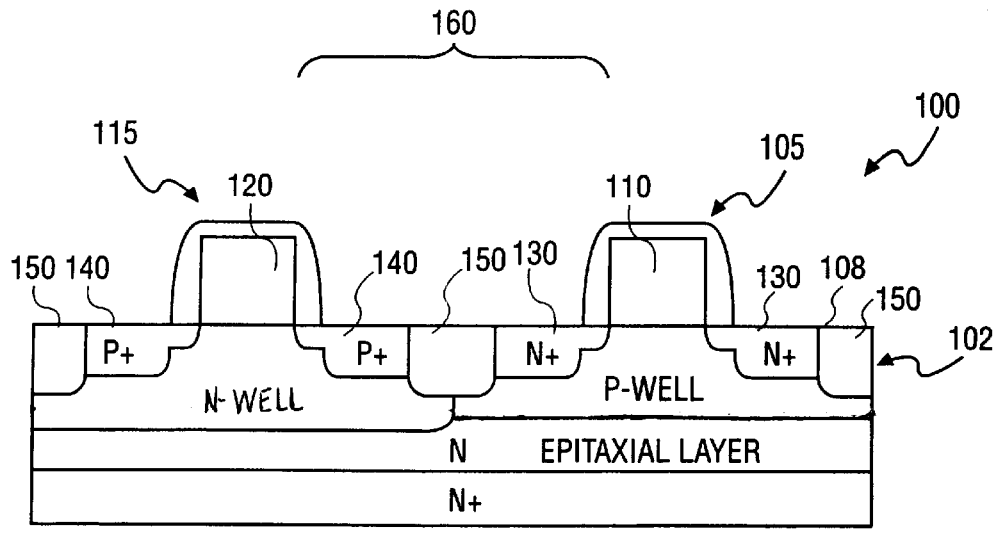
FIG. 1 schematically illustrates a cross-sectional side view of a portion of an integrated circuit substrate including devices formed thereon and therein in accordance with an embodiment of the invention.

Referring to the figures, FIG. 1 schematically shows a cross-sectional side view of a portion of an integrated circuit substrate having devices formed thereon and therein. Specifically, structure 100 includes substrate 102 that is for example a semiconductor substrate including N-type transistor device 105 and P-type transistor device 115. Transistor devices 105 and 115 are separated from one other and formed in active device regions defined by shallow trench isolation (STI) structures 150. N-type transistor device 105 includes gate electrode 110 formed over the surface of substrate 102 (typically over a gate dielectric) and junction or diffusion regions 130 formed in substrate 102. Transistor device 115 includes gate electrode 120 formed over the surface of substrate 102 and junction or diffusion regions 140 formed in substrate 102.

As device densities of an integrated circuit structure increase, the location between transistor devices generally decrease as more devices are introduced in a given area on a substrate (e.g., chip). Thus, electrical isolation of devices becomes more difficult. Accordingly, once devices are formed on a structure, such as is illustrated in FIG. 1, a PMD layer or film is introduced over the surface of the structure to isolate the individual transistor devices and the interconnect structures that form the electrical connections to the devices. Among other properties, the PMD layer should have adequate gap fill to fill gaps, such as gap 160 between the transistor devices.

Figure 2:
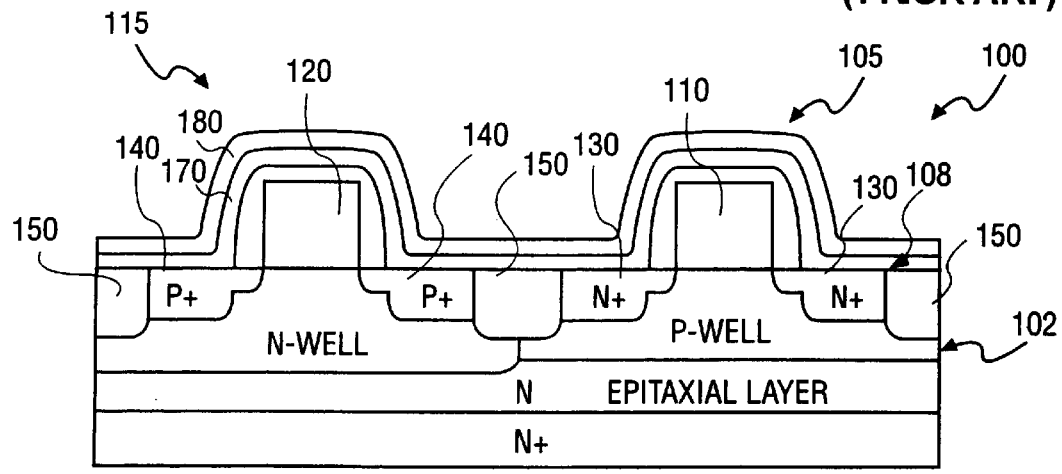
FIG. 2 shows the structure of FIG. 1 following the introduction of a portion of an aggregate layer or film including a nitrogen-containing dielectric layer and a barrier layer in accordance with an embodiment of the invention.

FIG. 2 shows the structure of FIG. 1 after the introduction of a thin film of a nitrogen-containing dielectric material, such as silicon nitride ($Si_3N_4$), over surface 108 of substrate 102. In this regard, nitrogen-containing layer or film 170 is conformably introduced over surface 108 of substrate 102 and over gate electrodes 110 and 120, respectively. Nitrogen-containing layer or film 170 serves both as a dielectric or passivation layer as well as an etch stop for forming openings through a subsequently introduced dielectric material as will become clear in the following paragraphs. Silicon nitride is generally considered to have a dielectric constant that is too high to make it suitable as a complete PMD layer. Accordingly, in the embodiment where silicon nitride is selected as nitrogen-containing layer or film 170, silicon nitride is introduced such as by chemical vapor deposition (CVD), as a thin film on the order of, for example, about 20 to 200 angstroms to serve a purpose as an etch stop.

FIG. 2 also shows the structure of FIG. 1 following the conformal introduction of barrier layer or film 180 over nitrogen-containing layer or film 170. Barrier layer or film 180 is selected, in one embodiment, as a material that would tend not to consume the nitrogen in nitrogen-containing layer or film 170 during subsequent thermal processing or annealing. In another aspect, barrier layer or film 180 is selected to be a material that has properties (e.g., reflow properties) enabling the achievement of suitable gap fill criteria with state of the art device densities.

Suitable materials for barrier layer or film 180 include, but are not limited to, dielectric materials that do not contain phosphorous. It is believed during reflow or thermal processing that phosphorus consumes nitrogen. By adding a barrier layer or film that is free of phosphorous, the nitrogen consumption during subsequent thermal processing may be controlled. Representative materials for barrier layer or film 180, include, but are not limited to, borosilicate glass (BSG) and undoped silicate glass (USG). Each of BSG and USG may be introduced as thin films on the order of, in one example, less than 1000 $\mu$m (where the subsequently applied layer or film is BPSG). One way to introduce such thin films of BSG or USG is by a CVD process with rapid thermal processing (RTP) on the order of about 30 seconds.

Figure 3:
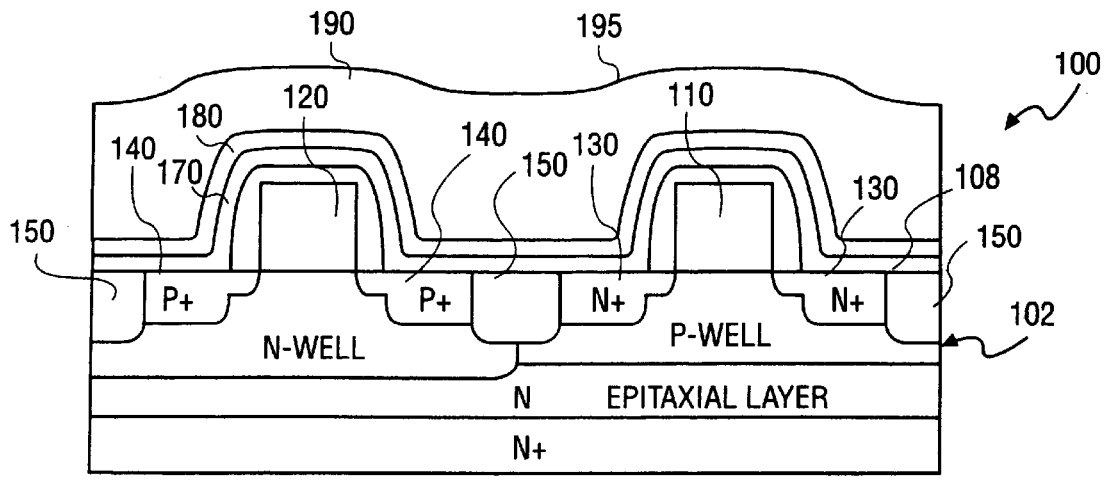
FIG. 3 shows the structure of FIG. 2 following the introduction and planarization of a dielectric film containing phosphorus in accordance with one embodiment of the invention.

FIG. 3 shows the structure of FIG. 2 following the introduction of phosphorous-containing layer or film 190 over the structure. In one embodiment, phosphorous-containing layer or film 190 is a dielectric material selected for its gap-fill properties, particularly, as here, where the material forms a portion of a PMD layer. The gettering properties of the phosphorous are also desirous. One suitable material for phosphorous-containing layer or film 190 is borophosphosilicate glass (BPSG). In one embodiment phosphorous-containing layer or film 190 is conformably deposited to a thickness on the order of, for example, greater than 2000 angstroms for state of the art integrated circuit structures. A typical introduction technique is CVD.

In order to improve the gap-fill properties of the PMD layer (represented in FIG. 3 as including nitrogen-containing layer or film 170, barrier layer or film 180, and phosphorous-containing layer or film 190), structure 100 may be subjected to thermal processing or annealing following introduction of the PMD layer. Annealing or thermal processing temperatures greater than 700° C., such as 830° C. in the presence of steam or nitrogen gas in an RTP process for BPSG is suitable.

It is believed that annealing or thermal processing at greater than 700° C. tends to make phosphorous in phosphorous-containing layer or film 190, mobile. In one regard, barrier layer or film 180, it is also believed, effectively slows the path of phosphorus to nitrogen in nitrogen-containing layer or film 170. By slowing the path, less nitrogen is consumed. In this regard, the insulating properties of nitrogen-containing layer or film 170 will not be diminished due to nitrogen consumption.

FIGS. 1–3 show a PMD layer or film that is an aggregate of nitrogen-containing layer or film 170, barrier layer or film 180, and phosphorous-containing layer or film 190. It is to be appreciated that the layers of the aggregate may remain as individual layers or, particularly given the subsequent thermal processing to which the materials may be exposed, combined in an additive or reactive fashion.

Figure 4:
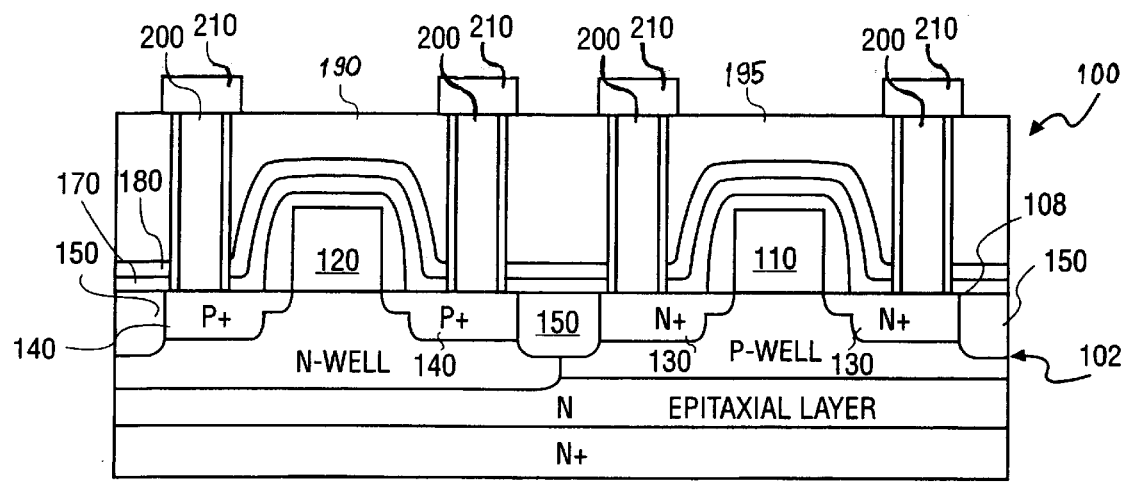
FIG. 4 shows the structure of FIG. 3 after the introduction of interconnect structures over the planarized dielectric film.

FIG. 4 shows the structure of FIG. 3 following the planarization of phosphorous-containing layer or film 190 and the formation and filling of vias or openings to diffusion or junction regions of individual transistor devices 105 and 115, respectively. In one embodiment, the planarization of phosphorous-containing layer or film 190 of BPSG is accomplished through a polish (e.g., a chemical-mechanical polish) as known in the art. Vias or openings are formed through phosphorous-containing layer or film 190, barrier layer or film 180 and nitrogen-containing layer or film 170 through etching, with for example, an etch chemistry as known in the art. In this regard, the selection of material for barrier layer or film 180 may be such that a single etch chemistry may be used to form an opening through both phosphorous-containing layer or film 190 and barrier layer or film 180. Alternatively, a dry etch may be used.

Having formed openings or vias in the PMD layer, the openings or vias may be filled with a conductive material. One common approach is to introduce a titanium adhesion layer along the sidewalls of the opening or via, followed by a titanium nitride barrier layer also along the sidewalls. The remainder of the opening or via is then filled with tungsten. Interconnects 210 of for example, aluminum or copper material (including alloys of aluminum or copper) are then introduced and patterned on surface 195 of PMD layer over the conductive vias or openings. The introduction and patterning of interconnects 210 may be accomplished as known in the art.

In the above paragraphs, an aggregate suitable as a PMD layer is described. The aggregate is described in terms of a PMD layer where a phosphorous-containing dielectric material (e.g., BPSG) is often used in conjunction with a nitrogen-containing material (e.g., $Si_3N_4$). The presence of the barrier layer or film tends to reduce nitrogen consumption generally seen during thermal processing between directly-disposed phosphorous- and nitrogen-containing materials. It is appreciated, however, that an aggregate such as described may be used in a variety of situations where nitrogen consumption in the presence of phosphorous is a concern. Such other applications include, but are not limited to, intermetal dielectric layers or films.

In the preceding detailed description, a method and apparatus are described with reference to specific embodiments thereof. It will, however, be evident that various modifications and changes may be made thereto without departing from the broader spirit and scope of the invention as set forth in the claims. For example, in the preceding detailed description, the method and apparatus are described with reference to an integrated circuit structure. Such structures include, but are not limited to, electrical and optical structures. Substrates over which the aggregate may be formed may thus include, but are not limited to, semiconductor, ceramic, and glass substrates or a combination of a semiconductor, ceramic, and/or glass substrate. The specification and drawings are, accordingly, to be regarded in an illustrative rather than a restrictive sense.

What is claimed is:

1. A method comprising:
   over an active area of a substrate, forming an aggregate as one of a pre-metal dielectric layer and an interlayer dielectric layer, the aggregate comprising a barrier layer, a first dielectric layer comprising nitrogen, and a second dielectric layer comprising phosphorous, and disposing the barrier layer between the first dielectric layer and the second dielectric layer; and
   after forming the aggregate, thermally treating the substrate.

2. The method of claim 1, wherein the substrate comprises a device base and at least one metal layer and forming the aggregate comprises introducing the aggregate between the device base and the at least one metal layer.

3. The method of claim 1, wherein the substrate comprises a non-planar surface and forming the aggregate comprises introducing the aggregate directly over the non-planar surface.

4. The method of claim 1, wherein the substrate comprises at least one trench and forming the aggregate comprises introducing the aggregate in the at least one trench.

5. The method of claim 1, wherein the first dielectric layer comprises silicon nitride.

6. The method of claim 5, wherein the barrier layer comprises a phosphorous-free dielectric material.

7. The method of claim 6, wherein the barrier layer comprises boron.

8. A method comprising:
   over an active area of a substrate, forming a barrier layer directly over a first dielectric layer comprising nitrogen;
   introducing a second dielectric layer comprising phosphorous directly over the barrier layer; and
   thermally treating the substrate.

9. The method of claim 8, wherein the substrate comprises a device base and at least one metal layer, and introducing the first dielectric layer comprises introducing the first dielectric layer between the device base and the at least one metal layer.

10. The method of claim 8, wherein the substrate comprises a non-planar surface and introducing the aggregate comprises introducing the aggregate directly over the non-planar surface.

11. The method of claim 8, wherein the substrate comprises at least one trench and introducing the aggregate comprises introducing the aggregate in the at least one trench.

12. The method of claim 4, wherein the barrier layer comprises a dielectric material.

13. The method of claim 5, wherein the barrier layer comprises boron.

14. A method comprising:
   over an active area of a substrate, forming an aggregate as one of a pre-metal dielectric layer and an interlayer dielectric layer, the aggregate comprising a barrier layer, a first dielectric layer comprising nitrogen, and a second dielectric layer comprising phosphorous, and disposing the barrier layer between the first dielectric layer and the second dielectric layer.

15. The method of claim 14, wherein the barrier layer comprises a phosphorous-free dielectric material.

* * * * *